(12) United States Patent
Kamiya et al.

(10) Patent No.: US 6,689,539 B2
(45) Date of Patent: Feb. 10, 2004

(54) PHOTOSENSITIVE COMPOSITION AND PHOTOSENSITIVE LITHOGRAPHIC PRINTING PLATE

(75) Inventors: Masamichi Kamiya, Ota (JP); Koji Hayashi, Tatebayashi (JP); Hirotaka Komine, Tatebayashi (JP); Miyuki Makino, Tatebayashi (JP)

(73) Assignee: Kodak Polychrome Graphics LLC, Norwalk, CT (US)

( * ) Notice: Subject to any disclaimer, the term of this patent is extended or adjusted under 35 U.S.C. 154(b) by 83 days.

(21) Appl. No.: 09/839,906

(22) Filed: Apr. 20, 2001

(65) Prior Publication Data

US 2002/0048721 A1 Apr. 25, 2002

(30) Foreign Application Priority Data

Jan. 5, 2000 (JP) ...................... P2000-132808

(51) Int. Cl.[7] .............. G03C 1/73; G03C 1/76; G03F 7/038
(52) U.S. Cl. .............. 430/287.1; 430/270.1; 430/286.1; 430/271.1; 430/302; 430/907; 430/905; 430/910
(58) Field of Search .............. 430/270.1, 287.1, 430/286.1, 281.1, 271.1, 302, 905, 907, 910

(56) References Cited

U.S. PATENT DOCUMENTS

| | | | | |
|---|---|---|---|---|
| 2,367,661 A | 1/1945 | Agre | ................. | 204/158 |
| 2,448,828 A | 9/1948 | Benfrew | ............... | 204/162 |
| 2,642,416 A | 6/1953 | Ahlbrecht et al. | ......... | 260/83.5 |
| 2,722,512 A | 11/1955 | Crandall | ............. | 204/158 |
| 2,760,863 A | 8/1956 | Plambeck, Jr. | ........... | 95/5.6 |
| 2,803,615 A | 8/1957 | Ahlbrecht et al. | ......... | 260/29.6 |
| 2,826,564 A | 3/1958 | Bovey et al. | ............. | 260/83.5 |
| 3,046,127 A | 7/1962 | Barney et al. | ............ | 96/35 |
| 3,060,023 A | 10/1962 | Burg et al. | ............ | 96/28 |
| 3,102,103 A | 8/1963 | Ahlbrecht et al. | ......... | 260/29.6 |
| 3,282,905 A | 11/1966 | Fasick et al. | ............ | 260/89.5 |
| 3,304,278 A | 2/1967 | Hauptschein et al. | ...... | 260/29.6 |
| 3,549,367 A | 12/1970 | Chang et al. | ........... | 96/35.1 |
| 3,751,259 A | 8/1973 | Bauer et al. | ............ | 96/115 |
| 4,123,276 A | 10/1978 | Kita et al. | ........... | 96/91 |
| 4,212,970 A | 7/1980 | Iwasaki | ............. | 542/455 |
| 4,239,850 A | 12/1980 | Kita et al. | ............ | 430/281 |
| 4,424,325 A * | 1/1984 | Tsunoda et al. | ......... | 526/245 |
| 4,822,713 A | 4/1989 | Nishioka et al. | ......... | 430/175 |

FOREIGN PATENT DOCUMENTS

| | | |
|---|---|---|
| EP | 0239082 | 9/1987 |
| EP | 0 949 539 A2 * | 10/1999 |
| JP | 4841708 | 6/1973 |
| JP | 4864183 | 9/1973 |
| JP | 4943191 | 4/1974 |
| JP | 506034 | 1/1975 |
| JP | 50118802 | 9/1975 |
| JP | 5137193 | 3/1976 |
| JP | 5148516 | 4/1976 |
| JP | 52030490 | 3/1977 |
| JP | 5415711 | 2/1979 |
| JP | 5430121 | 3/1979 |
| JP | 54098614 | 8/1979 |
| JP | 55000527 | 1/1980 |
| JP | 56039464 | 4/1981 |
| JP | 56042860 | 4/1981 |
| JP | 57042858 | 3/1982 |
| JP | 57051656 | 3/1982 |
| JP | 5743890 | 9/1982 |
| JP | 57192952 | 11/1982 |
| JP | 5924844 | 2/1984 |
| JP | 59084241 | 5/1984 |
| JP | 59208552 | 11/1984 |
| JP | 60165646 | 8/1985 |
| JP | 60203630 | 10/1985 |
| JP | 61034046 | 2/1986 |
| JP | 61128243 | 6/1986 |
| JP | 61162039 | 7/1986 |
| JP | 61250048 | 11/1986 |
| JP | 61273538 | 12/1986 |
| JP | 61285449 | 12/1986 |
| JP | 62094840 | 5/1987 |
| JP | 62121448 | 6/1987 |
| JP | 62153305 | 7/1987 |
| JP | 62283108 | 12/1987 |
| JP | 01018142 | 1/1989 |
| JP | 03172849 | 7/1991 |
| JP | 03249655 | 7/1991 |
| JP | 03260650 | 11/1991 |
| JP | 06186736 | 7/1994 |
| JP | 08015858 * | 1/1996 |
| JP | 10282658 | 3/1998 |
| JP | 10319582 | 4/1998 |
| JP | 1069080 | 10/1998 |
| JP | 11095431 | 4/1999 |

OTHER PUBLICATIONS

Machine–Assisted English translation of JP 11–095431 (Kaji et al), provided by Japan Patent Office, 1999.*
JPO English Abstract for JP 08015858, 1996.*
Formal English translation of JP 11–95431 (Kaji et al) provided by USPTO (Schreiber Translations, Inc.), Apr. 9, 1999.*

* cited by examiner

Primary Examiner—Janet Baxter
Assistant Examiner—Sin J. Lee
(74) Attorney, Agent, or Firm—Faegre & Benson, LLP

(57) ABSTRACT

The present invention provides a photosensitive lithographic printing plate which displays superior ink receptivity and superior film strength of the photosensitive layer (image area). The photosensitive lithographic printing plate is produced by providing, on top of a support, a photosensitive composition comprising a fluororesin having a fluoro aliphatic group of 3 to 20 carbon atoms in which at least two of three terminal hydrogen atoms are substituted for fluorine atoms, and an ethylene based unsaturated group, as well as a negative photosensitive compound.

25 Claims, No Drawings

PHOTOSENSITIVE COMPOSITION AND PHOTOSENSITIVE LITHOGRAPHIC PRINTING PLATE

BACKGROUND OF THE INVENTION

1. Field of the Invention

The present invention relates to a photosensitive composition and a photosensitive lithographic printing plate which utilizes the photosensitive composition, and in particular to a photosensitive lithographic printing plate with superior ink receptivity and with a photosensitive layer (image area) which displays superior film strength, or a photosensitive lithographic printing plate with superior ink receptivity and with a uniform coating film of photosensitive layer, or a photosensitive lithographic printing plate with superior ink receptivity and with a photosensitive layer (image area) which displays superior film strength, which can be developed by an alkali developing solution incorporating no organic solvents, as well as to photosensitive compositions for producing such photosensitive lithographic printing plates.

2. Description of the Related Art

Photosensitive lithographic printing plates are typically formed by providing a photosensitive layer comprising a photosensitive compound on the surface of a support such as aluminum, paper or plastic, which has undergone suitable surface treatment. Such photosensitive lithographic printing plates are manufactured by the application of a photosensitive composition, comprising a photosensitive compound which has been dissolved or dispersed in an organic solvent, to the surface of the support, followed by subsequent drying.

Photosensitive lithographic printing plates of this type, such as a negative lithographic printing plate using a diazo resin as the photosensitive compound, are generally used in the manner described below.

First, with a negative film or the like superimposed thereon, the photosensitive layer of a negative photosensitive lithographic printing plate is exposed to light, and the exposed areas undergo polymerization and/or cross linking, and become insoluble in the developing solution. The photosensitive lithographic printing plate is then developed, and the unexposed areas are eluted by the developing solution. In this manner, the areas insoluble in the developing solution are termed the image area, and repel water and receive the oil based ink, whereas the areas eluted by the developing solution are termed the non-image area, and receive water and repel the oil based ink.

However, in negative photosensitive lithographic printing plates which use diazo resins, the oil sensitivity of the image area is typically low and the ink receptivity at the start-up of printing is insufficient, leading to an increase in waste paper.

Techniques to improve the ink receptivity of negative photosensitive lithographic printing plates are already known, and include a method disclosed in Japanese Unexamined Patent Application, First Publication No. Sho-55-527 in which an oil sensitizer such as a half ester of a copolymer of styrene and maleic anhydride is added to the photosensitive composition.

However, this type of oil sensitizer is eluted from the photosensitive layer during developing, and suffers from being unable to display sufficient improvement in the ink receptivity. Furthermore, incorporating an oil sensitizer in the photosensitive layer causes other problems such as a reduction in the film strength of the photosensitive layer (the image area), and a reduction in the sensitivity of the photosensitive lithographic printing plate.

Furthermore, in order to realize the properties of the photosensitive composition in the photosensitive lithographic printing plate, it is necessary, during the application and drying of the photosensitive composition on the surface of the support, to ensure the formation of a uniform photosensitive layer on the support.

Photosensitive compositions disclosed in Japanese Unexamined Patent Application, First Publication No. Sho-62-170950 and Japanese Unexamined Patent Application, First Publication No. Sho-62-226143 aim to form a uniform photosensitive layer on a support, and propose photosensitive compositions which comprise, as a fluorine based surfactant, a polymer with a fluoro aliphatic group in which three terminal carbon atoms are well fluorinated, and a poly (oxyalkylene) group.

However, although these type of fluorine based surfactants improve the non-uniformity of the photosensitive layer, the uniformity of the photosensitive layer is still not always sufficient. Furthermore, because the poly (oxyalkylene) group is hydrophilic, there is an associated reduction in ink receptivity at the start-up of printing.

Photosensitive compositions disclosed in Japanese Unexamined Patent Application, First Publication No. Hei-1-18142 and Japanese Unexamined Patent Application, First Publication No. Hei-3-172849 aim to improve the ink receptivity in cases where a fluorine based surfactant is added, and propose photosensitive compositions which comprise, as the fluorine based surfactant, a polymer with a fluoro aliphatic group in which three terminal carbon atoms are well fluorinated, a poly (oxyalkylene) group, and either an aliphatic hydrocarbon group or a cyclic hydrocarbon group.

However, even though the ink receptivity improves, the improvement is not always sufficient, and the uniformity of the photosensitive layer is still insufficient.

Furthermore, in conventional negative photosensitive lithographic printing plates, binder resins in which functional groups with an acidic hydrogen atom, such as carboxyl groups or phenolic hydroxyl groups, have been introduced, are often used to improve the developability. In particular, in order to make development possible with alkali developing solutions which comprise no organic solvents, large numbers of these functional groups with acidic hydrogen atoms need to be introduced into the binder resin.

However, these functional groups with acidic hydrogen atoms are hydrophilic, and as a result, the sensitivity of the photosensitive lithographic printing plate and the film strength of the photosensitive layer (image area) are both reduced, and the ink receptivity at the start-up of printing also deteriorates.

SUMMARY OF THE INVENTION

An object of the present invention is to provide a photosensitive lithographic printing plate with superior ink receptivity and with a photosensitive layer (image area) which displays superior film strength, and a photosensitive composition for producing such a photosensitive lithographic printing plate.

Furthermore, another object of the present invention is to provide a photosensitive lithographic printing plate with superior ink receptivity and with a uniform photosensitive layer, and a photosensitive composition for producing such a photosensitive lithographic printing plate.

Furthermore, yet another object of the present invention is to provide a photosensitive lithographic printing plate with superior ink receptivity and with a photosensitive layer (image area) which displays superior film strength which can be developed by an alkali developing solution incorporating no organic solvents, and a photosensitive composition for producing such a photosensitive lithographic printing plate.

As a result of in-depth investigations aimed at realizing the above objects, the inventors of the present invention discovered that by using a fluororesin having a fluoro aliphatic group and an ethylene based unsaturated group as an oil sensitizer, using a fluororesin having a fluoro aliphatic group, a poly (oxyalkylene) group, and an ethylene based unsaturated group as a fluorine based surfactant, and using a fluororesin having a fluoro aliphatic group, an ethylene based unsaturated group, and a functional group having an acidic hydrogen atom as an alkali soluble resin, the above objects could be achieved, and as a result completed the present invention.

In other words, a photosensitive composition of the present invention includes a fluororesin with a fluoro aliphatic group of 3 to 20 carbon atoms in which at least two of three terminal hydrogen atoms are substituted for fluorine atoms, and an ethylene based unsaturated group; as well as a negative photosensitive compound.

Furthermore, the aforementioned fluororesin may also include a poly (oxyalkylene) group.

Furthermore, the aforementioned fluororesin may also include a functional group having an acidic hydrogen atom.

Furthermore, the aforementioned fluororesin may also have a maleimide structure.

Furthermore, the aforementioned fluororesin may preferably be an acrylic resin.

Furthermore, a photosensitive composition of the present invention may preferably also include a binder resin.

Furthermore, a photosensitive lithographic printing plate of the present invention is produced by providing a photosensitive composition of the present invention on a support.

DETAILED DESCRIPTION OF THE INVENTION

As follows is a detailed description of the present invention.

A photosensitive composition of the present invention comprises specific fluororesins and a negative photosensitive compound.

In the present invention, a fluororesin having a fluoro aliphatic group of 3 to 20 carbon atoms in which at least two of three terminal hydrogen atoms are substituted for fluorine atoms (hereafter abbreviated as an Rf group), and an ethylene based unsaturated group is used as an oil sensitizer, a fluororesin having an Rf group, a poly (oxyalkylene) group, and an ethylene based unsaturated group is used as a fluorine based surfactant, and a fluororesin having an Rf group, an ethylene based unsaturated group, and a functional group with an acidic hydrogen atom is used as an alkali soluble resin. As follows is a description of each of these fluororesins.

Oil Sensitizer

In an embodiment according to the present invention, the fluororesin used as the oil sensitizer comprises an Rf group and an ethylene based unsaturated group.

The Rf group is normally saturated, and is typically a monovalent or bivalent aliphatic group. This aliphatic group may comprise a straight chain, a branched chain, a cyclic structure, or a combination of these three (for example an alkylcyclo aliphatic group). The fluoro aliphatic structure may include a chained oxygen atom which is connected to only carbon atoms and/or a trivalent nitrogen hetero atom. The hetero atom produces stable bonds between fluorocarbon groups, and moreover does not adversely affect the inactivity characteristics of the Rf group.

The Rf group comprises 3 to 20 carbon atoms, and preferably 6 to 12 carbon atoms, and comprises at least 30% by weight, and preferably no less than 40% by weight, of fluorine bonded to carbon atoms, relative to the total weight of the Rf group. Furthermore, at least two of three terminal hydrogen atoms of the Rf group are substituted with fluorine atoms.

Examples of the terminals of this type of Rf group include $CF_3CF_2CF_2$—for example. Perfluoro alkyl groups are particularly desirable for the Rf group. Perfluoro groups refer to alkyl groups which have been substantially or almost completely fluorinated, such as $C_nF_{2n+1}$ (where n is an integer of 3 or greater).

Improvements in ink receptivity are marked when the rate of incorporation of fluorine into the Rf group is at least 30% by weight, relative to the total weight of the Rf group. This improvement is even greater in those cases when the fluorine atoms are localized at the terminals of the Rf group.

For Rf groups with two or fewer carbon atoms, the fluorine incorporation ratio can be increased, but the total number of fluorine atoms remains insufficient, and the degree of improvement in the ink receptivity is reduced. Furthermore, in those cases where the fluorine incorporation ratio in a copolymer is increased by increasing the proportion of a monomer unit comprising a well fluorinated Rf group of two or fewer carbon atoms, the fluorine atoms are not localized, and so the degree of improvement in the ink receptivity is reduced.

In contrast, in the case of Rf groups which have 21 or more carbon atoms and have a high fluorine incorporation ratio, the obtained copolymer displays a reduced solubility in solvents. Furthermore, in the case of Rf groups of 21 or more carbon atoms in which the fluorine incorporation ratio is low, the localization of the fluorine atoms is insufficient, and so the degree of improvement in the ink receptivity is reduced.

Examples of the ethylene based unsaturated group include acryloyl groups, methacryloyl groups, vinyl groups, allyl groups, propenyl groups, butenyl groups, styryl groups and cinnamyl groups. Of these, acryloyl groups and methacryloyl groups are preferred as they offer superior reactivity, and offer superior prevention of reductions in ink receptivity, sensitivity and film strength.

The fluororesin used as the oil sensitizer may preferably also include the maleimide structure, represented by the general chemical formula (1) shown below.

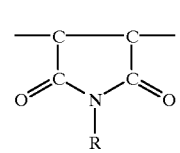

(1)

(In the formula, R represents a hydrogen atom, or a hydrocarbon group such as an alkyl group, an alkenyl group, or an aryl group.)

Fluororesins which include this type of maleimide structure offer even greater improvements in the ink receptivity. Within maleimide structures, N-substituted maleimide structures are preferred, and N-cyclic hydrocarbon substituted maleimide structures are even more desirable.

In this embodiment according to the present invention, the fluororesin used as the oil sensitizer may have the Rf group and the ethylene based unsaturated group, and there are no other particular restrictions on the type of resin. Examples of fluororesins which can be used as the oil sensitizer include acrylic resins having an Rf group and an ethylene based unsaturated group on a side chain, polyurethane based resins having an Rf group and an ethylene based unsaturated group on a side chain, and polyvinyl acetal based resins having an Rf group and an ethylene based unsaturated group on a side chain. Of these, acrylic resins offer an abundant variety of raw material monomers, and are very convenient in terms of controlling a variety of properties of the product photosensitive composition, and are consequently used in preference.

Acrylic resins having an Rf group and an ethylene based unsaturated group on a side chain can be prepared by conventionally known methods. For example, a (meth)acrylate having an Rf group could be combined with another addition polymerizable unsaturated compound by carrying out thermal polymerization in an organic solvent in which a typical radical polymerization initiator is added. Then, the obtained acrylic resin is further reacted to introduce an ethylene based unsaturated group into a side chain. In the present invention, the term "(meth)acrylate" is used as a generic term covering acrylates and methacrylates.

Specific examples of methods of introducing an ethylene based unsaturated group into a side chain of an acrylic resin, include a method wherein a (meth)acrylate having an Rf group is combined with a (meth)acrylate having a hydroxyl group, (meth)acrylic acid, or a (meth)acrylate having a glycidyl group, by carrying out thermal polymerization in an organic solvent, in which other unsaturated compounds are added as necessary to undergo addition polymerization, and the obtained acrylic resin product is then further treated by reacting a (meth)acryloylisocyanate with the hydroxyl group of a side chain of the obtained acrylic product, reacting glycidyl (meth)acrylate with the carboxyl group of a side chain of the obtained acrylic product, or reacting (meth) acrylic acid with the glycidyl group of a side chain of the obtained acrylic product, as well as a method wherein a (meth)acrylate having at least an Rf group is combined with maleic anhydride by carrying out the thermal polymerization, and the obtained acrylic resin product is then further reacted with a compound such as a (meth) acrylate having a hydroxyl group, or an allyl alcohol. Furthermore, another possible method involves the reaction of a compound such as an allyl chloride or an allyl glycidyl ether with the carboxyl group of the side chain of the aforementioned acrylic resin product.

Examples of (meth)acrylates having an Rf group include compounds represented by the formula $Rf-R^1-OCO-C(R^2)=CH_2$ (where $R^1$ represents a single bond, an alkylene, a sulfonamide alkylene, or a carbonamide alkylene, and $R^2$ represents a hydrogen atom or a methyl group). Specific examples of this type of compound are disclosed in U.S. Pat. Nos. 2,803,615, 2,642,416, 2,826,564, 3,102,103, 3,282,905, and 3,304,278.

Examples of (meth)acrylates having a hydroxyl group include 2-hydroxyethyl (meth)acrylate, 2-hydroxypropyl (meth)acrylate, 2-hydroxybutyl (meth)acrylate, diethylene glycol mono (meth)acrylate, and 2-hydroxy-3-phenoxypropyl (meth)acrylate.

An example of a (meth)acrylate having a glycidyl group is glycidyl (meth)acrylate.

Examples of other unsaturated compounds which undergo addition polymerization include acrylic acid esters such as methyl (meth)acrylate, ethyl (meth)acrylate, propyl (meth)acrylate, butyl (meth)acrylate, amyl (meth)acrylate, 2-ethylhexyl (meth)acrylate, octyl (meth)acrylate, 2-chloroethyl (meth)acrylate, cyclohexyl (meth)acrylate, diethylaminoethyl (meth)acrylate, furfuryl (meth)acrylate, tetrahydrofuryl (meth)acrylate, phenyl (meth)acrylate, hydroxyphenyl (meth)acrylate, cresyl (meth)acrylate, naphthyl (meth)acrylate, benzyl (meth)acrylate, and methoxybenzyl (meth)acrylate; (meth)acrylamides such as (meth) acrylamide, N-ethyl (meth)acrylamide, N-propyl (meth) acrylamide, N-butyl (meth)acrylamide, N-hexyl (meth) acrylamide, N-octyl (meth)acrylamide, N-cyclohexyl (meth)acrylamide, N-methylol (meth)acrylamide, N-hydroxyethyl (meth)acrylamide, N-benzyl (meth) acrylamide, N-phenyl (meth)acrylamide, N-nitrophenyl (meth)acrylamide, N-tolyl (meth)acrylamide, N-hydroxyphenyl (meth)acrylamide, N,N-dimethyl (meth) acrylamide, N,N-diethyl (meth)acrylamide, and N,N-dicyclohexyl (meth)acrylamide; N-substituted maleimides such as N-methylmaleimide, N-ethylmaleimide, N-propylmaleimide, N-butylmaleimide, N-pentylmaleimide, N-n-hexylmaleimide, N-laurylmaleimide, N-stearylmaleimide, N-cyclohexylmaleimide, N-phenylmaleimide, N-chlorophenylmaleimide, N-tolylmaleimide, N-hydroxymaleimide, and N-benzylmaleimide; allyl compounds such as allyl acetate, allyl caproate, allyl stearate, and allyloxyethanol; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, and diethylaminoethyl vinyl ether; vinyl esters such as vinyl acetate, vinyl butylate, vinyl caproate, vinyl chloroacetate, vinyl methoxyacetate, vinyl phenylacetate, vinyl acetoacetate, vinyl benzoate, and vinyl chlorobenzoate; styrenes such as styrene, α-methylstyrene, methylstyrene, dimethylstyrene, chloromethylstyrene, ethoxymethylstyrene, hydroxystyrene, chlorostyrene, and bromostyrene; vinyl ketones such as methyl vinyl ketone, ethyl vinyl ketone, propyl vinyl ketone, and phenyl vinyl ketone; olefins such as isobutylene, butadiene, and isoprene; as well as other compounds such as butyl crotonate, dimethyl itaconate, diethyl itaconate, dimethyl maleate, diethyl fumarate, N-vinyl pyrolidone, N-vinyl pyridine, and acrylonitrile.

Examples of methods of incorporating a maleimide structure within the fluororesin include a method wherein an amine compound is added to a polymer containing maleic anhydride (an imidization), and a method wherein a (meth) acrylate having an Rf group, a compound comprising a maleimide stucture, and a (meth)acrylate having a hydroxyl group, (meth)acrylic acid, or a (meth)acrylate having a glycidyl group are polymerized. These types of methods are disclosed in, for example, Japanese Patent Application, First Publication No. Sho-59-24844, Japanese Patent Application, First Publication No. Sho-61-34046, Japanese Unexamined Patent Application, First Publication No. Sho-61-128243, Japanese Unexamined Patent Application, First Publication No. Sho-61-162039, Japanese Unexamined Patent Application, First Publication No. Sho-61-250048, Japanese Unexamined Patent Application, First Publication No. Sho-62-94840, Japanese Unexamined Patent Application, First Publication No. Sho-62-153305, and Japanese Unexamined Patent Application, First Publication No. Sho-62-283108. A representative example of a polymer containing maleic anhydride is a styrene/maleic anhydride copolymer.

Examples of compounds comprising a maleimide structure include N-substituted maleimides such as N-phenylmaleimide, N-phenylmethylmaleimide, N-chlorophenylmaleimide, N-methoxyphenylmaleimide, N-methylphenylmaleimide, N-dimethylphenylmaleimide, N-ethylphenylmaleimide, N-diethylphenylmaleimide, N-nitrophenylmaleimide, N-phenoxyphenylmaleimide, N-hydroxyphenylmaleimide, N-carboxyphenylmaleimide, N-phenylcarbonylphenylmaleimide, N-methylmaleimide, N-ethylmaleimide, N-vinylmaleimide, N-allylmaleimide, N-cyclohexylmaleimide and N-laurylmaleimide; as well as non-N-substituted maleimides such as maleimide. In the substituted phenyl groups bonded to the maleimides described above, the substituted group may be bonded to any of the carbon atoms of the phenyl group other than that bonded to the N atom.

For the oil sensitizer of the embodiment according to the present invention, compositions, in which the (meth)acrylate unit having an Rf group is included in an amount of 10 to 70% by weight, relative to the total weight of the copolymer, offer good solubility in solvents, display a good improvement in ink receptivity, and are used in preference.

For the oil sensitizer of the embodiment according to the present invention, compositions, in which the monomer unit having an ethylene based unsaturated group is included in an amount of 5 to 60% by weight, relative to the total weight of the copolymer, display a good improvement in ink receptivity, are able to prevent reductions in sensitivity and film strength, and are therefore used in preference.

In this manner, the fluororesin used as the oil sensitizer comprises a hydrophilic Rf group, and so produces an excellent improvement in the ink receptivity. Furthermore, this type of fluororesin also comprises an ethylene based unsaturated group, which hardens in the photosensitive layer on exposure to light. As a result, the amount of fluororesin eluted away by the developing solution during developing of the photosensitive lithographic printing plate can be reduced, and reductions in the ink receptivity, the sensitivity, and the film strength can be prevented.

Fluorine Based Surfactant

In an embodiment according to the present invention, a fluororesin used as the fluorine based surfactant comprises an Rf group, a poly (oxyalkylene) group, and an ethylene based unsaturated group.

Suitable Rf groups and ethylene based unsaturated groups include the same Rf groups and ethylene based unsaturated groups described above in relation to the oil sensitizer.

The Rf group comprises 3 to 20 carbon atoms, and preferably 6 to 12 carbon atoms, and comprises at least 30% by weight, and preferably no less than 40% by weight, of fluorine bonded to carbon atoms, relative to the total weight of the Rf group. Improvements in surfactant action and ink receptivity are marked when the rate of incorporation of fluorine into the Rf group is at least 30% by weight, relative to the total weight of the Rf group. These improvements are even greater in those cases when the fluorine atoms are localized at the terminals of the Rf group.

For Rf groups having two or fewer carbon atoms, the fluorine incorporation ratio in the Rf groups can be increased, but the total number of fluorine atoms in the Rf groups remains insufficient, and the degree of improvement in the surfactant action and the ink receptivity is reduced. Furthermore, in those cases where the fluorine incorporation ratio in a copolymer is increased by increasing the proportion of a monomer unit comprising a well fluorinated Rf group of two or fewer carbon atoms, the fluorine atoms are not localized, and so the degree of improvement in the surfactant action and the ink receptivity is reduced.

In contrast, in the case of Rf groups of 21 or more carbon atoms which also have a high fluorine incorporation ratio, the obtained copolymer displays a reduced solubility in solvents. Furthermore, in the case of Rf groups of 21 or more carbon atoms in which the fluorine incorporation ratio is low, the localization of the fluorine atoms is insufficient, and so the degree of improvement in the surfactant action and the ink receptivity is reduced.

Examples of poly (oxyalkylene) groups include poly (oxyethylene) groups, poly (oxypropylene) groups, poly (oxybutylene) groups, random copolymers of poly (oxyethylene-oxypropylene), and block copolymers of poly (oxyethylene-oxypropylene).

The oxyalkylene unit within the aforementioned poly (oxyalkylene) group may be a repeating identical oxyalkylene as in the case of poly (oxypropylene) for example, or may comprise two or more different oxyalkylenes which are distributed irregularly. Furthermore, the oxyalkylene unit may be either a straight chain or a branched chain oxypropylene and an oxyethylene unit, and may also be a substance in which a straight chain or a branched chain oxypropylene unit block or oxyethylene unit block exists. The poly (oxyalkylene) chain may be linked with one or more intermediary linkage bonds such as —CONH—Ph—NHCO or —S— or may include other chain linkage bonds (Ph here refers to a phenylene group). When a chain linkage has a valency of three or greater, the poly (oxyalkylene) chain becomes a branched chain oxyalkylene unit.

The molecular weight of the poly (oxyalkylene) group is typically between 100 and 5,000, preferably between 200 and 1000. Furthermore, the poly (oxyalkylene) group units are preferably present in the fluororesin in proportions of at least 10% by weight, relative to the total weight of a single fluororesin molecule. In those cases where the poly (oxyalkylene) group units are present in the fluororesin in proportions of at least 10% by weight, defects such as pinholes are less likely to occur in the coating of the photosensitive composition.

The fluororesin used as the fluorine based surfactant may preferably comprise the maleimide structure shown in the chemical formula 1 above. Fluororesins which include this type of maleimide structure offer even greater improvements in the ink receptivity. Within maleimide structures, N-substituted maleimide structures are preferred, and N-cyclic hydrocarbon substituted maleimide structures are even more desirable.

In the embodiment according to the present invention, the fluororesin used as the fluorine based surfactant may have an Rf group, a poly (oxyalkylene) group, and an ethylene based unsaturated group, and there are no other particular restrictions on the type of resin. Examples of fluororesins which can be used as the fluorine based surfactant include acrylic resins having an Rf group, a poly (oxyalkylene) group, and an ethylene based unsaturated group on a side chain, polyurethane based resins having an Rf group, a poly (oxyalkylene) group, and an ethylene based unsaturated group on a side chain, and polyvinyl acetal based resins having an Rf group, a poly (oxyalkylene) group, and an ethylene based unsaturated group on a side chain. Of these, since the acrylic resins are obtained from an abundant variety of raw material monomers, the acrylic resins are very convenient in terms of controlling a variety of properties of the product photosensitive composition, and are consequently used in preference.

Acrylic resins having an Rf group, a poly (oxyalkylene) group, and an ethylene based unsaturated group on a side chain can be prepared by conventionally known methods. For example, a (meth)acrylate having an Rf group is combined with a (meth)acrylate having a poly (oxyalkylene)

group by carrying out thermal polymerization in an organic solvent, in which a typical radical polymerization initiator is added, and in which addition polymerizable unsaturated compounds having an acidic hydrogen atom, or other unsaturated compounds which undergo addition polymerization are added as necessary. Then, the obtained acrylic resin is further reacted to introduce an ethylene based unsaturated group into a side chain.

A specific example of a method of introducing an ethylene based unsaturated group into a side chain of the acrylic resin is a method wherein a (meth)acrylate having an Rf group is combined with a (meth)acrylate having a poly (oxyalkylene) group, and a (meth)acrylate having a hydroxyl group, (meth) acrylic acid, or a (meth)acrylate having a glycidyl group, by carrying out thermal polymerization in an organic solvent in which an addition polymerizable unsaturated compound having an anionic group, an addition polymerizable unsaturated compound having an acidic hydrogen atom, or other unsaturated compound which undergoes addition polymerization is added as necessary, and the obtained acrylic resin product is further treated by reacting a (meth)acryloyl isocyanate with the hydroxyl group of a side chain of the obtained acrylic resin product, reacting glycidyl (meth) acrylate with the carboxyl group of a side chain of the obtained acrylic resin product, or reacting (meth)acrylic acid with the glycidyl group of a side chain of the obtained acrylic resin product. Furthermore, another possible method involves the reaction of a compound such as allyl chloride or allyl glycidyl ether with the carboxyl group of the side chain of the obtained acrylic resin product.

Furthermore, methods of incorporating a maleimide structure within the fluororesin are identical with the methods described above in relation to the oil sensitizer.

The same materials as those described above in relation to the manufacture of the oil sensitizer can be used for the (meth)acrylate having an Rf group, the (meth)acrylate having a hydroxyl group, the (meth)acrylate having a glycidyl group, and the other unsaturated compounds which undergo addition polymerization.

Examples of the (meth)acrylate having a poly (oxyalkylene) group are those formed by the reaction of hydroxypoly (oxyalkylene) with (meth)acrylic acid, (meth) acryloyl chloride, or (meth)acrylic anhydride using known methods.

Examples of the aforementioned hydroxypoly (oxyalkylene) include the products "Prulonic" and "Adeka polyether" (manufactured by Asahi Denka Kogyo Ltd.), "Torinto" (manufactured by Rohm and Hass Ltd.), "Carbowax" (manufactured by Glyco Products Ltd.), and "P.E.G." (manufactured by Daiichi Kogyo Seiyaku Ltd).

Examples of addition polymerizable unsaturated compounds having an anionic group include unsaturated compounds which undergo addition polymerization and have a $—SO_3^-M^+$ group or a $—COO^-M^+$ group (where $M^+$ here represents a metallic ion, an ammonium ion, or the like). Specific examples include the sodium, potassium, and amine salts of p-styrene sulfonic acid, 2-acrylamide-2-methylpropane sulfonic acid, 2-chloroethyl sulfonic acid, ethylene disulfonic acid, 1-propene-1-sulfonic acid, 1-propene-2-sulfonic acid, 2-methyl-1,3-propene disulfonic acid, 1-butene-1-sulfonic acid, 1-pentene-1-sulfonic acid, 1-hexene-1-sulfonic acid, 2-phenylethylene sulfonic acid, 1-methyl-2-phenylethylene sulfonic acid, 3-chloroallyl sulfonic acid, allyl sulfonic acid, 3-chloro-2-butene sulfonic acid, 3-chlorometa-allyl sulfonic acid, meta-allyl sulfonic acid, 3-methyl-2-butene-2-sulfonic acid, 3-phenylallyl sulfonic acid, 3-phenylmeta-allyl sulfonic acid, 2-benzylallyl sulfonic acid, 2-chloro-4-styrene sulfonic acid, vinyltoluene sulfonic acid, α-methylstyrene sulfonic acid, (meth)acrylic acid, maleic anhydride, fumaric acid, crotonic acid, itaconic acid, and the like.

Examples of addition polymerizable unsaturated compounds with an acidic hydrogen atom include (meth)acrylic acid, addition polymerizable unsaturated compounds having a phenolic hydroxyl group, and compounds such as $CH_2=C(R^2)—CO—X^1—R^3—SO_2NH—R^4$, and $CH_2=C(R^2)—CO—X^2—R^5—NHSO_2—R^6$. In these formulae, $X^1$ and $X^2$ each represent either —O— or $—NR^7—$, $R^3$ and $R^5$ each represent a $C_1–C_{12}$ alkylene group, a $C_1–C_{12}$ cycloalkylene group, a $C_1–C_{12}$ arylene group, or a $C_1–C_{12}$ aralkylene group, which may have substituted groups, $R^4$ represents a hydrogen atom, or a $C_1–C_{12}$ alkyl group, a $C_1–C_{12}$ cycloalkyl group, a $C_1–C_{12}$ aryl group, or a $C_1–C_{12}$ aralkyl group, which may have substituted groups, $R^6$ represents a $C_1–C_{12}$ alkyl group, a $C_1–C_{12}$ cycloalkyl group, a $C_1–C_{12}$ aryl group, or a $C_1–C_{12}$ aralkyl group, which may have substituted groups, and $R^7$ represents a hydrogen atom,or a $C_1–C_{12}$ alkyl group, a $C_1–C_{12}$ cycloalkyl group, a $C_1–C_{12}$ aryl group, or a $C_1–C_{12}$ aralkyl group, which may have substituted groups.

Examples of addition polymerizable unsaturated compounds having a phenolic hydroxyl group include (meth) acrylamides such as N-(4-hydroxyphenyl)-(meth)acrylamide, N-(2-hydroxyphenyl)-(meth)acrylamide, and N-(4-hydroxynaphthyl)-(meth)acrylamide; as well as o-hydroxyphenyl (meth)acrylate, m-hydroxyphenyl (meth) acrylate, and p-hydroxyphenyl (meth)acrylate; o-hydroxystyrene, m-hydroxystyrene, and p-hydroxystyrene; and o-hydroxyphenylmaleimide, m-hydroxyphenylmaleimide, and p-hydroxyphenylmaleimide.

For the fluorine based surfactant, compositions, in which the (meth)acrylate unit having an Rf group is included in the copolymer in proportion of between 10 and 70% by weight, relative to the total weight of the copolymer, offer good solubility in solvents, display a good surfactant action and a good improvement in the ink receptivity, and are therefore used in preference.

For the fluorine based surfactant, compositions, in which the (meth)acrylate unit having a poly (oxyalkylene) group is included in the copolymer in proportion of between 5 and 60% by weight, relative to the total weight of the copolymer, are less likely to suffer from defects such as pinholes in the coating of the photosensitive composition, display a good surfactant action and a good improvement in ink receptivity, and are therefore used in preference.

Furthermore, for the fluorine based, compositions, in which the monomer unit having an ethylene based unsaturated group is included in the copolymer in proportion of between 5 and 60% by weight, relative to the total weight of the copolymer, display a good improvement in ink receptivity, and are therefore used in preference.

In this manner, the fluororesin used as the fluorine based surfactant comprises a polar poly (oxyalkylene) group and a nonpolar Rf group, and so exhibits good surfactant action. Furthermore, the fluorine based surfactant also comprises a hydrophilic Rf group, and so produces an excellent improvement in the ink receptivity. Moreover, this type of fluororesin also comprises an ethylene based unsaturated group, which hardens in the photosensitive layer on exposure to light. As a result, reductions in the ink receptivity due to the hydrophilic poly (oxyalkylene) group can be prevented.

Alkali Soluble Resin

In an embodiment according to the present invention, a fluororesin used as the alkali soluble resin may include an Rf group, an ethylene based unsaturated group, and a functional group having an acidic hydrogen atom.

Suitable Rf groups and ethylene based unsaturated groups include the same Rf groups and ethylene based unsaturated groups described above in relation to the oil sensitizer.

The Rf group comprises 3 to 20 carbon atoms, and preferably 6 to 12 carbon atoms, and comprises at least 30% by weight, and preferably no less than 40% by weight, of fluorine bonded to carbon atoms, relative to the total weight of the Rf group. Improvements in the ink receptivity are marked, when the rate of incorporation of fluorine in the Rf group is at least 30% by weight, relative to the total weight of the Rf group. This improvement is even greater in those cases where the fluorine atoms are localized at the terminals of the Rf group.

For Rf groups having two or fewer carbon atoms, the fluorine incorporation ratio can be increased, but the total number of fluorine atoms remains insufficient, and the degree of improvement in the ink receptivity is reduced. Furthermore, in those cases where the fluorine incorporation ratio in a copolymer is increased by increasing the proportion of a monomer unit comprising a well fluorinated Rf group of two or fewer carbon atoms, the fluorine atoms are not localized, and so the degree of improvement in the ink receptivity is reduced.

In contrast, in the case of Rf groups of 21 or more carbon atoms which also have a high fluorine incorporation ratio, the obtained copolymer displays a reduced solubility in solvents. Furthermore, in the case of Rf groups of 21 or more carbon atoms in which the fluorine incorporation ratio is low, the localization of the fluorine atoms is insufficient, and so the degree of improvement in the ink receptivity is reduced.

Examples of the functional group having an acidic hydrogen atom include carboxyl groups, phenolic hydroxyl groups, $-SO_2NH_2$, $-SO_2NH-$, $-CONHCO-$, $-COCH_2CO-$, $-SO_2NHCO-$, $-CONHSO_2NH-$, $-SO_2NHSO2-$, and $-SO_3H$.

The fluororesin used as the alkali soluble resin may also preferably comprise the maleimide structure shown in the chemical formula 1 above. The fluororesins which include this type of maleimide structure offer even greater improvements in the ink receptivity. Within maleimide structures, N-substituted maleimide structures are preferred, and N-cyclic hydrocarbon substituted maleimide structures are even more desirable.

In the embodiment according to the present invention, the fluororesin used as the alkali soluble resin may have an Rf group, an ethylene based unsaturated group, and a functional group having an acidic hydrogen atom, and there are no other particular restrictions on the type of resin. Examples of the fluororesins which can be used as the alkali soluble resin include acrylic resins having an Rf group, an ethylene based unsaturated group, and a functional group having an acidic hydrogen atom on a side chain, polyurethane based resins having an Rf group, an ethylene based unsaturated group, and a functional group having an acidic hydrogen atom on a side chain, and polyvinyl acetal based resins having an Rf group, an ethylene based unsaturated group, and a functional group having an acidic hydrogen atom on a side chain. Of these, the acrylic resins offer an abundant variety of raw material monomers, and are very convenient in terms of controlling a variety of properties of the product photosensitive composition, and are consequently used in preference.

Acrylic resins having an Rf group, an ethylene based unsaturated, and a functional group having an acidic hydrogen atom on a side chain can be manufactured by conventionally known methods. For example, a (meth)acrylate having an Rf group could be combined in an organic solvent with an addition polymerizable unsaturated compound including an acidic hydrogen atom and other unsaturated compounds which undergo addition polymerization by carrying out thermal polymerization in an organic solvent in which a typical radical polymerization initiator is added, and then, the obtained acrylic resin is further reacted to introduce an ethylene based unsaturated group into a side chain.

Specific examples of methods of introducing an ethylene based unsaturated group into a side chain of the acrylic resin, include a method wherein a (meth)acrylate having an Rf group are combined with an addition polymerizable unsaturated compound having an acidic hydrogen atom, and a (meth)acrylate having a hydroxyl group, (meth)acrylic acid, or a (meth)acrylate having a glycidyl group, by carrying out thermal polymerization in an organic solvent in which other unsaturated compounds are added as necessary to undergo addition polymerization, and then, the obtained acrylic resin product is further treated by reacting a (meth)acryloylisocyanate with the hydroxyl group of a side chain, or reacting glycidyl (meth)acrylate with the carboxyl group, or reacting (meth)acrylic acid with the glycidyl group, as well as a method wherein a (meth)acrylate with at least an Rf group undergoes thermal polymerization with maleic anhydride, and the acrylic resin product is then further reacted with a compound such as a (meth)acrylate having a hydroxyl group, or allyl alcohol. Furthermore, another possible method involves the reaction of a compound such as allyl chloride or allyl glycidyl ether with the carboxyl group of the side chain of the aforementioned acrylic resin.

Furthermore, methods of incorporating a maleimide structure within the fluororesin are identical with the methods described above in relation to the oil sensitizer.

The same materials as those described above in relation to the manufacture of the oil sensitizer can be used for the (meth)acrylate having an Rf group, the (meth)acrylate having a hydroxyl group, the (meth)acrylate having a glycidyl group, and the other unsaturated compounds which undergo addition polymerization.

Furthermore, the same materials as those described above in relation to the manufacture of the fluorine based surfactant can be used for the addition polymerizable unsaturated compound having an acidic hydrogen atom.

For the alkali soluble resin, compositions, in which the (meth)acrylate unit having an Rf group is included in the copolymer in proportion of between 10 and 70% by weight, relative to the total weight of the copolymer, offer good solubility in solvents, display a good improvement in the ink receptivity, and are therefore used in preference.

Furthermore, for the alkali soluble resin of the present invention, compositions, in which the monomer unit having an ethylene based unsaturated group is included in the copolymer in proportion of between 5 to 60% by weight, relative to the total weight of the copolymer, display a good improvement in the ink receptivity, and are therefore used in preference.

Furthermore, for the alkali soluble resin, compositions, in which the unit of the addition polymerizable unsaturated compound with an acidic hydrogen atom is included in the copolymer in proportion of between 5 to 60% by weight, relative to the total weight of the copolymer, offer sufficient alkali developability, and are therefore used in preference.

In this manner, the fluororesin used as the alkali soluble resin comprises a functional group having an acidic hydrogen atom, and so offers excellent alkali developability. Furthermore, this type of fluororesin also comprises a hydrophilic Rf group, and so produces an excellent improvement in the ink receptivity. Moreover, this type of fluororesin also comprises an ethylene based unsaturated group, which hardens in the photosensitive layer on exposure to light. As a result, reductions in the ink receptivity, sensitivity, and film strength due to the functional group having a hydrophilic acidic hydrogen atom can be prevented.

Photosensitive Composition

As follows is a more detailed description of a photosensitive composition of an embodiment according to the present invention, using a photosensitive composition for a photosensitive lithographic printing plate as an example.

A photosensitive composition for a photosensitive lithographic printing plate comprises the aforementioned fluororesins, a negative photosensitive compound, and where necessary, a binder resin, other additives, and the like.

In the embodiment according to the present invention, the proportion of the fluororesin used as the oil sensitizer may preferably be in the range from 0.01 to 10% by weight, even more preferably be in the range from 0.05 to 5% by weight, relative to the total weight of the photosensitive composition (including all the coating constituents, but no solvent). If the proportion of the oil sensitizer is under 0.01% by weight, relative to the total weight of the photosensitive composition, the degree of improvement in the ink receptivity is insufficient. In contrast, if the proportion of the oil sensitizer exceeds 10% by weight, relative to the total weight of the photosensitive composition, there is a danger of causing deleterious effects on properties such as the developability.

The proportion of the fluororesin used as the fluorine based surfactant may preferably be in the range from 0.01 to 5% by weight, even more preferably be in the range from 0.05 to 3% by weight, relative to the total weight of the photosensitive composition (including all the coating constituents, but no solvent). If the proportion of the fluorine based surfactant is less than 0.01% by weight, relative to the total weight of the photosensitive composition, both the surfactant action and the degree of improvement in the ink receptivity are insufficient. In contrast, if the proportion of the fluorine based surfactant exceeds 5% by weight, relative to the total weight of the photosensitive composition, there is a danger of causing deleterious effects on properties such as the developability.

The proportion of the fluororesin used as the alkali soluble resin may preferably be in the range from 0.01 to 30% by weight, even more preferably be in the range from 0.05 to 20% by weight, relative to the total weight of the photosensitive composition (including all the coating constituents, but no solvent). If the proportion of the alkali soluble resin is less than 0.01% by weight, relative to the total weight of the photosensitive composition, the degree of improvement in the ink receptivity is insufficient. In contrast, if the proportion of the alkali soluble resin exceeds 30% by weight, relative to the total weight of the photosensitive composition, there is a danger of causing deleterious effects on properties such as the developability.

Examples of the preferred negative photosensitive compound include (1) photosensitive diazonium compounds, (2) combinations of a compound having an addition polymerizable unsaturated group and a photopolymerization initiator, and (3) combinations of a photosensitive diazonium compound, a compound having an addition polymerizable unsaturated group, and a photopolymerization initiator.

Examples of (1) photosensitive diazonium compounds include diazo resins such as a salt of the condensation product of diazodiarylamine and an activated carbonyl compound, and materials which are photosensitive, insoluble in water, and soluble in organic solvents are preferable.

Particularly suitable diazo resins include organic acid salts or inorganic acid salts of condensation products of compounds such as 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, and 4-diazo-3-methoxydiphenylamine, with compounds such as formaldehyde, paraformaldehyde, acetaldehyde, benzaldehyde, and 4,4'-bis-methoxymethyldiphenyl ether.

Examples of diazo resin organic acids include methane sulfonic acid, benzene sulfonic acid, toluene sulfonic acid, xylene sulfonic acid, mesitylene sulfonic acid, dodecylbenzene sulfonic acid, naphthalene sulfonic acid, propylnaphthalene sulfonic acid, 1-naphthol-5-sulfonic acid, 2-nitrobenzene sulfonic acid, 3-chlorobenzene sulfonic acid, and 2-hydroxy-4-methoxybenzophenone-5-sulfonic acid, whereas inorganic acids include hexafluoro phosphoric acid, tetrafluoro boric acid, and thiocyanic acid.

Other types of diazo resins which can be used include diazo resins disclosed in Japanese Unexamined Patent Application, First Publication No. Sho-54-30121 in which the principal chain is a polyester group; diazo resins produced by reacting polymers disclosed in Japanese Unexamined Patent Application, First Publication No. Sho-61-273538 which comprise carboxylic acid anhydride residues, with a diazo compound comprising a hydroxyl group; and diazo resins produced by reacting a polyisocyanate compound with a diazo compound comprising a hydroxyl group.

The amount of diazo resin used may preferably be within the range from 0 to 40% by weight, relative to the total weight of the composition solid material. Two or more diazo resins may be used together, if necessary.

Examples of (2) combinations of a compound having an addition polymerizable unsaturated group and a photopolymerization initiator include combinations of a photopolymerization initiator and a compound having an addition polymerizable unsaturated group which comprises two or more terminal ethylene groups, such as those combinations disclosed in U.S. Pat. Nos. 2,760,863, 3,060,023, and Japanese Unexamined Patent Application, First Publication No. Sho-62-121448.

The aforementioned compounds having an addition polymerizable unsaturated group are monomers or oligomers having boiling points at normal pressure of at least 100° C., and at least one, and preferably two or more, ethylene based unsaturated groups which are able to undergo addition polymerization. Examples of this type of monomer or oligomer include monofunctional (meth)acrylates such as polyethylene glycol mono-(meth)acrylate, polypropylene glycol mono-(meth)acrylate, and phenoxyethyl (meth)acrylate; as well as polyfunctional (meth)acrylates such as polyethylene glycol di-(meth)acrylate, polypropylene glycol di-(meth)acrylate, trimethylolpropane tri-(meth)acrylate, neopentyl glycol di-(meth)acrylate, pentaerythritol tri-(meth)acrylate, pentaerythritol tetra-(meth)acrylate, dipentaerythritol hexa-(meth)acrylate, hexanediol di-(meth)acrylate, tri-(acryloyloxyethyl) isocyanurate, a (meth)acrylate of a polyvalent alcohol and alkylene oxide adduct, a (meth)acrylate of a polyvalent phenol and alkylene oxide adduct, urethane acrylates such as those disclosed in Japanese Examined Patent Application, Second Publication No. Sho-48-41708, Japanese Examined Patent Application, Second Publication No. Sho-50-6034, and Japanese Examined Patent Application, Second Publication No. Sho-51-37193, polyester acrylates such as those disclosed in Japanese Unexamined Patent Application, First Publication No. Sho-48-64183, Japanese Examined Patent Application, Second Publication No. Sho-49-43191, and Japanese Examined Patent Application, Second Publication No. Sho-52-30490, and epoxy acrylates formed by addition reactions between epoxy resins and (meth)acrylic acid.

The amount of the compound having an addition polymerizable unsaturated group used may preferably be within a range from 5 to 70% by weight, relative to the total weight of the composition solid material.

Examples of the photopolymerization initiator include α-carbonyl compounds as disclosed in U.S. Pat. No. 2,367,661, acyloin ethers as disclosed in U.S. Pat. No. 2,448,828, α-hydrocarbon substituted aromatic acyloin compounds as disclosed in U.S. Pat. No. 2,722,512, polynuclear quinone compounds as disclosed in U.S. Pat. No. 3,046,127, combinations of a triaryl biimidazole and a p-aminophenyl ketone as disclosed in U.S. Pat. No. 3,549,367, trihalomethyl-s-triazine based compounds as disclosed in U.S. Pat. No. 4,239,850, oxadiazole compounds as disclosed in U.S. Pat. No. 4,212,970, acridine and phenazine compounds as disclosed in U.S. Pat. No. 3,751,259, and benzothiazole based compounds as disclosed in Japanese Examined Patent Application, Second Publication No. Sho-51-48516. The amount of the photopolymerization initiator used may preferably be within a range from 0.5 to 20% by weight, reltative to the total weight of the composition solid material.

Features of the aforementioned negative photosensitive compound are (1) the adhesion between a photosensitive layer and a support is excellent if the photosensitive diazonium compound is used, (2) exposure to light yields a tough coating if the combination of the compound having the addition polymerizable unsaturated group and the photopolymerization initiator is used, and (3) a coating is obtained which displays both of the above features if the combination of the photosensitive diazonium compound, the compound having the addition polymerizable unsaturated group, and the photopolymerization initiator is used.

From the viewpoint of improving properties such as the developability, the press life, the solvent resistance, and the chemical resistance, photosensitive compositions for use in photosensitive lithographic printing plates may preferably include a binder resin. Examples of this binder resin include acrylic resins, polyamide resins, polyester resins, epoxy resins, polyacetal resins, polystyrene resins, and novolak resins.

More specifically, suitable binder resins include copolymers such as (meth)acrylic acid/(meth)acrylic acid ester copolymers, copolymers including a hydroxyalkyl (meth) acrylate having an acid value of 10 to 100 and a (meth) acrylonitrile as disclosed in U.S. Pat. No. 4,123,276, copolymers including an aromatic hydroxyl group as disclosed in Japanese Examined Patent Application, Second Publication No. Sho-57-43890, and copolymers comprising a 2-hydroxy-3-phenoxypropyl (meth)acrylate unit as disclosed in Japanese Examined Patent Application, Second Publication No. Sho-57-51656; epoxy resins; polyamide resins; halogenated vinyl resins such as polyvinyl chloride and polyvinylidene chloride; polyvinyl acetate; polyesters; acetal resins such as formal resins and butyral resins; soluble polyurethane resins marketed by the American company Goodrich Ltd. under the brand name Estan; polystyrenes; styrene/maleic anhydride copolymers or half esters thereof; cellulose derivatives; shellac; rosin or modifications thereof; and copolymers with an unsaturated group in a side chain as disclosed in Japanese Unexamined Patent Application, First Publication No. Sho-61-285449 and Japanese Unexamined Patent Application, First Publication No. Hei-10-282658.

In the case of photosensitive compositions which include a photocrosslinkable resin as a binder resin, the photocrosslinkable resin may preferably have an affinity for aqueous alkali developing solutions. Examples of this type of photocrosslinkable resin include copolymers having a cinnamic acid group and a carboxyl group as disclosed in Japanese Examined Patent Application, Second Publication No. Sho-54-15711; polyester resins having a phenylenediacrylic acid residue group and a caroboxyl group as disclosed in Japanese Unexamined Patent Application, First Publication No. Sho-60-165646; polyester resins with a phenylenediacrylic acid residue group and a phenolic hydroxyl group as disclosed in Japanese Unexamined Patent Application, First Publication No. Sho-60-203630; polyester resins with a phenalenediacrylic acid residue group and a sodium iminodisulfonyl group as disclosed in Japanese Examined Patent Application, Second Publication No. Sho-57-42858; and polymers with an azide group and a carboxyl group on a side chain as disclosed in Japanese Unexamined Patent Application, First Publication No. Sho-59-208552.

Moreover, other known additives such as thermal polymerization inhibitors, dyes, pigments, plasticizers, stabilizers, and surfactants can also be added in order to improve performance.

Suitable dyes include basic oil soluble dyes such as crystal violet, malachite green, victoria blue, methylene blue, ethyl violet, and rhodamine B. Examples of commercially available products include "Victoria Pure Blue-BOH" (manufactured by Hodogaya Chemical Industries Ltd.) and "Oil Blue #603" (manufactured by Orient Chemical Industries Ltd.). Suitable pigments include phthalocyanine blue, phthalocyanine green, dioxazine violet, and quinacridone red.

Suitable plasticizers include diethylphthalate, dibutylphthalate, dioctylphthalate, tributyl phosphate, trioctyl phosphate, tricresyl phosphate, tri-(2-chloroethyl) phosphate, and tributyl citrate.

In addition, examples of known stabilizers include phosphoric acid, phosphorous acid, oxalic acid, tartaric acid, malic acid, citric acid, dipicolinic acid, polyacrylic acid, benzenesulfonic acid, and toluenesulfonic acid.

The amount added of each of the above additives will vary depending on the purpose, although typically values within the range from 0 to 30% by weight, relative to the total weight of the photosensitive composition solid are preferable.

Photosensitive Lithographic Printing Plate

A photosensitive lithographic printing plate of the present invention is constructed basically of a support, and a photosensitive layer of an aforementioned photosensitive composition provided on top of the support.

Suitable examples of the support include metallic plates made of metals such as aluminum, zinc, copper, stainless steel, steel, or the like; plastic films such as polyethylene terephthalate, polycarbonate, polyvinyl acetal, or polyethylene; composite materials such as papers coated with a molten synthetic resin or coated with a synthetic resin solution, or plastic films with a metallic layer provided thereon by using techniques such as vacuum deposition or lamination; or other materials used as supports for printing plates.

Furthermore, in the case of supports using metallic surfaces, and particularly in the case of aluminum, it is preferable that the support has undergone some type of surface treatment such as a graining treatment, anodization treatment, or hydrophilic treatment.

A photosensitive lithographic printing plate of the present invention is manufactured by coating the surface of a support with a photosensitive composition which has been either dissolved or dispersed in an organic solvent, and then drying the photosensitive composition to form a photosensitive layer on top of the support.

Any conventional organic solvent can be used as the solvent for dissolving or dispersing the photosensitive composition. However, from the viewpoint of convenience during the drying process, solvents having a boiling point of between 40° C. and 200° C., preferably between 60° C. and 160° C. are usually selected.

Examples of suitable organic solvents include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methyl cyclohexanone, and acetyl acetone; hydrocarbons such as hexane, cyclohexane, heptane, octane, nonane, decane, benzene, toluene, xylene, and methoxybenzene; esters such as ethyl acetate, n- or iso-propyl acetate, n- or iso-butyl acetate, ethyl butyl acetate, and hexyl acetate; halides such as methylene dichloride, ethylene dichloride, and monochlorobenzene; ethers such as isopropyl ether, n-butyl ether, dioxane, dimethyl dioxane, and tetrahydrofuran; polyhydric alcohols and derivatives thereof such as ethylene glycol, methylcellosolve, methylcellosolve acetate, ethylcellosolve, diethylcellosolve, cellosolve acetate, butylcellosolve, butylcellosolve acetate, methoxymethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, and 3-methyl-3-methoxybutanol; and special solvents such as dimethylsulfoxide, N,N-dimethylformamide, methyl lactate, and ethyl lactate. These solvents may be used singularly, or in mixtures of two or more solvents. The concentration of solid material within the photosensitive composition to be coated onto the support may typically be from 2 to 50% by weight.

Examples of suitable coating methods for applying the photosensitive composition include roll coating, dip coating, air knife coating, gravure coating, gravure offset coating, hopper coating, blade coating, wire doctor coating, and spray coating. The amount of photosensitive composition applied during the coating process may preferably be within a range from 10 ml/m$^2$ to 100 ml/m$^2$.

Drying of the photosensitive composition coated onto the support surface is usually carried out using heated air. The air temperature may preferably be heated to a temperature within a range from 30° C. to 200° C., preferably within a range from 40° C. to 140° C. The drying temperature is maintained at a constant level during the drying process. Alternatively, the drying temperature is gradually stepped up.

Furthermore, in some cases it may be beneficial to use a stream of air for moisture absorption. The heated air may preferably be blown over the coating at a rate of 0.1 m/s to 30 m/s, with values from 0.5 m/s to 20 m/s being particularly desirable.

The weight of the photosensitive composition coating following drying is typically within a range from approximately 0.5 to 5 g/m$^2$.

In a photosensitive lithographic printing plate formed in the manner described above, the photosensitive layer is exposed to light with a negative film or the like superimposed thereon, and once the exposed portions of the photosensitive layer are hardened and become insoluble, the plate is developed in a developing solution, which dissolves and removes the unexposed portions, producing a lithographic printing plate with a corresponding image formed on the support.

Suitable light sources used in the light exposure process include carbon arc lamps, mercury lamps, metal halide lamps, xenon lamps, chemical lamps, and lasers.

For the developing solution, a typical amine based alkali developing solution including an organic solvent, such as the developing solutions used in developing negative photosensitive lithographic printing plates, may be used. Furthermore, in those cases where the alkali soluble resin is used as a binder resin, an aqueous alkali developing solution which includes no substantial amounts of organic solvents may also be used. Here, an aqueous alkali developing solution which includes no substantial amounts of organic solvents refers to an aqueous alkali developing solution which comprises no more than 2% by weight of organic solvents, relative to the total weight of the aqueous alkali developing solution. Organic solvents are typically poisonous and odorous, and are also dangerous in terms of flammability. Furthermore, the waste liquids from developing solutions comprising organic solvents also suffer many drawbacks, such as being required to meet BOD regulations. Moreover, developing solutions which comprise organic solvents are also expensive. Consequently, aqueous alkali developing solutions which include no substantial amounts of organic solvent are superior in terms of environmental impact, safety, work efficiency, and the like.

Examples of amine based alkali developing solutions comprising an organic solvent include aqueous alkali solutions which also comprise organic solvents such as benzyl alcohol and 2-phenoxyethanol, such as the developing solutions disclosed in Japanese Examined Patent Application, Second Publication No. Sho-56-39464 and Japanese Examined Patent Application, Second Publication No. Sho-56-42860.

Examples of aqueous alkali developing solutions which include no substantial amounts of organic solvent include aqueous solutions including alkali reagents such as sodium silicate, potassium silicate, potassium hydroxide, sodium hydroxide, lithium hydroxide, sodium triphosphate, sodium diphosphate, potassium triphosphate, potassium diphosphate, ammonium triphosphate, sodium metasilicate, sodium carbonate, potassium carbonate, aqueous ammonia, monoethanolamine, diethanolamine, triethanolamine, monoisopropanolamine, diisopropanolamine, monomethylamine, dimethylamine, and triethylamine.

The amount of the alkali reagent may preferably be included in the developing solution within the range from 0.05 to 10% by weight, even more preferably from 0.1 to 7% by weight, relative to the total weight of developing solution.

Furthermore, an anionic surfactant may also be added to the developing solution as necessary. Examples of suitable anionic surfactants include sulfate salts of higher alcohols of 8 to 22 carbon atoms such as the sodium salt of lauryl alcohol sulfate, the sodium salt of octyl alcohol sulfate, the ammonium salt of lauryl alcohol sulfate, and secondary sodium alkyl sulfates; aliphatic alcohol phosphate salts such as the sodium salt of cetyl alcohol phosphate; alkyl aryl sulfonates such as the sodium salt of dodecylbenzenesulfonate, the sodium salt of isopropylnaphthalenesulfonate, and the sodium salt of meta-nitrobenzenesulfonate; alkyl amide sulfonates such as $C_{17}H_{33}CON(CH_3)CH_2CH_2SO_3Na$; sulfonates of dibasic fatty acid esters such as dioctyl sodium sulfosuccinate and dihexyl sodium sulfosuccinate; and N-acyl amino acid salts such as the sodium salt of lauroyl methylalanine, the sodium salt of lauroyl sarcosine and the sodium salt of chochoyl sarcosine.

The amount of anionic surfactant included in a developing solution, may be in the range from 0 to 15% by weight, relative to the total weight of the developing solution at the time of use. At values greater than 15% by weight, various problems arise such as excessive dye elution (fading) from the exposed areas, and deterioration in both the mechanical and chemical strength of the plate, indicated by factors such as a deterioration in the abrasion resistance of the light hardened image areas.

Extremely small quantities of organic solvents may also be included in the aqueous alkali developing solution. A water solubility of the organic solvents is preferably no more than 10% by weight, even more preferably no more than 5% by weight, relative to the total weight of water in which the organic solvents are dissolved. Suitable examples include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. The amount of organic solvent used, may preferably be no more than 2% by weight, even more preferably no more than 1% by weight, relative to the total weight of the developing solution at the time of use.

Furthermore if required, additives such as antifoaming agents and water softeners may also be added to the aqueous alkali developing solution. Examples of suitable water softeners include polyphosphates such as $Na_2P_2O_7$, $Na_5P_3O_3$, $Na_3P_3O_9$, $Na_2O_4P(NaO_3P)$ $PO_3Na_2$, and Calgon (sodium polymetaphosphate); aminopolycarboxylic acids and derivatives thereof, such as ethylenediaminetetraacetic acid and the potassium salt and sodium salt thereof, diethylenetriaminepentaacetic acid and the potassium salt and sodium salt thereof, triethylenetetraminehexaacetic acid and the potassium salt and sodium salt thereof, hydroxyethylethylenediaminetriacetic acid and the potassium salt and sodium salt thereof, nitrilotriacetic acid and the potassium salt and sodium salt thereof, 1,2-diaminocyclohexanetetraacetic acid and the potassium salt and sodium salt thereof, and 1,3-diamino-2-propanoltetraacetic acid and the potassium salt and sodium salt thereof. The optimum amount of such a water softener varies depending on the hardness of the water and the amount of hard water used. However, typically the amount of water softener added to the developing solution is in the range from 0.01 to 5% by weight, even more preferably 0.01 to 0.5% by weight, relative to the developing solution at the time of use.

Furthermore if required, reducing inorganic salts may also be included in the aqueous alkali developing solution. Reducing inorganic salts have a reducing action. Water soluble inorganic salts are preferable as the reducing inorganic salt, with salts of short chain oxyacids being particularly desirable. Suitable examples of reducing inorganic salts include sulfites such as sodium sulfite, potassium sulfite, ammonium sulfite, lithium sulfite, sodium hydrogensulfite, and potassium hydrogensulfite; and phosphites such as sodium phosphite, potassium phosphite, sodium hydrogenphosphite, potassium hydrogenphosphite, sodium dihydrogenphosphite, and potassium dihydrogenphosphite. These salts may be used singularly, or in combinations of two or more salts. Of the above salts, alkali metal phosphites are preferred. The amount of the reducing inorganic salt added to the developing solution may preferably be within the range from 0.01 to 30% by weight, even more preferably from 0.01 to 10% by weight, relative to the developing solution.

Moreover if required, the aqueous alkali developing solution may also include organic boron compounds, aqueous pyrazolone compounds, alkali soluble mercapto compounds, and 1,3-dihydroxy aromatic compounds, and the salts thereof. These compounds may be used singularly, or in combinations of two or more compounds. The amount of such compounds added to the developing solution may preferably be no more than 10%, by weight relative to the developing solution. As the amount of this type of compound is increased, the ability of the solution to prevent soiling of the non-image area improves, although at values above 10% by weight, the mechanical strength of the exposed area deteriorates, leading to a reduction in print resistance if the solution is used with a lithographic printing plate.

The pH of the aqueous alkali developing solution may be at least 11, with pH values of 12 or more being preferable.

Examples of this type of aqueous alkali developing solution which includes no substantial amounts of organic solvent include the developing solutions used for developing the exposed positive lithographic printing plates disclosed in Japanese Unexamined Patent Application, First Publication No. Sho-59-84241 and Japanese Unexamined Patent Application, First Publication No. Sho-57-192952.

If required, the developed lithographic printing plate may be subjected to water washing treatment and oil desensitization; oil desensitization without any water washing treatment; treatment with an acidic aqueous solution; or treatment with an acidic aqueous solution and oil desensitization.

EXAMPLES

As follows is a more detailed description of the present invention, based on a series of examples. The present invention however, is not limited in any way by these examples. In the examples the unit % refers to % by weight.

Synthesis of a Fluorine Based Surfactant

The monomers shown in Table 1 and Table 2 were combined in the ratios shown in Table 3, and fluorine based surfactants were produced using the methods outlined below in the synthesis examples 1 to 6.

Synthesis Examples 1 to 6

160 g of methyl isobutyl ketone was heated to 80° C. under a stream of nitrogen, and a mixed solution of the monomers (with a combined weight of 69.8 g) and 0.4 g of azobisisobutyronitrile was then dripped in over a period of 2 hours. Two hours after completion of this addition, a further 0.4 g of azobisisobutyronitrile was added, and the mixture then allowed to react for 4 hours. Following completion of the reaction, a predetermined volume of isocyanate ethyl methacrylate (methacryloyloxyethylisocyanate) (chemical formula J) was dripped into the mixture, and 0.5 g of dibutyl tin dilaurate was added as a catalyst. Reaction was then permitted to proceed for a further 4 hours. The product following cooling was used as a surfactant.

Synthesis Examples 7 and 8

161 g of methyl glycol was heated to 80° C. under a stream of nitrogen, and a mixed solution of the monomers (with a combined weight of 69.8 g) and 0.4 g of azobisisobutyronitrile was then dripped in over a period of 2 hours. Two hours after completion of this addition, a further 0.4 g of azobisisobutyronitrile was added, and the mixture then allowed to react for 4 hours. Following completion of the reaction, a predetermined volume of allyl glycidyl ether was dripped into the mixture, and 1 g of 2-methylimidazole was added as a catalyst. Reaction was then permitted to proceed for a further 4 hours. The product following cooling was used as a surfactant.

Synthesis Examples 9 and 10

161 g of methyl isobutyl ketone was heated to 80° C. under a stream of nitrogen, and a mixed solution of the monomers (with a combined weight of 69.8 g) and 0.4 g of azobisisobutyronitrile was then dripped in over a period of 2 hours. Two hours after completion of this addition, a further 0.4 g of azobisisobutyronitrile was added, and the reaction was permitted to proceed for a further 4 hours. The product following cooling was used as a surfactant.

TABLE 1

| Chemical Formula | Compound Name | Abbreviation |
|---|---|---|
| $CH_2{=}CH{-}CO{-}O{-}CH_2{-}CH_2{-}N(C_3H_7){-}SO_2{-}C_8F_{17}$ | N-propylperfluorooctylsulfonyl aminoethyl acrylate | A |
| N-cyclohexylmaleimide structure | N-cyclohexylmaleimide | B |
| N-laurylmaleimide structure ($C_{12}H_{25}$) | N-laurylmaleimide | C |
| N-phenylmaleimide structure | N-phenylmaleimide | D |

TABLE 1-continued

| Chemical Formula | Compound Name | Abbreviation |
|---|---|---|
| $CH_2{=}CH{-}CO{-}O{-}(CH_2)_{11}{-}CH_3$ | Lauryl acrylate | E |

TABLE 2

| Chemical Formula | Compound Name | Abbreviation |
|---|---|---|
| $CH_2{=}C(CH_3){-}CO{-}(OC_2H_4)_8{-}OH$ | Polyoxyethylene methacrylate | F |
| $CH_2{=}C(CH_3){-}CO{-}O{-}H$ | Methacrylic acid | G |
| $CH_2{=}C(CH_3){-}CO{-}O{-}(CH_2)_2{-}OH$ | 2-hydroxyethyl methacrylate | H |
| $CH_2{=}CH{-}CH_2{-}O{-}CH_2{-}CH{-}CH_2$ (epoxide) | Allyl glycidyl ether | I |
| $CH_2{=}C(CH_3){-}CO{-}O{-}(CH_2)_2{-}NCO$ | Methacryloyloxyethyl isocyanate | J |

TABLE 3

| | Monomer composition ratio of fluorine based surfactant (wt %) | | | | | | | | Modifier | | |
|---|---|---|---|---|---|---|---|---|---|---|---|
| | A | B | C | D | E | F | G | H | I | J | Total |
| Synthesis example 1 | 29.8 | 17.5 | | | | 19.0 | | 15.3 | | 18.4 | 100.0 |
| Synthesis example 2 | 29.8 | | 17.5 | | | 19.0 | | 15.3 | | 18.4 | 100.0 |
| Synthesis example 3 | 29.8 | | | 17.5 | | 19.0 | | 15.3 | | 18.4 | 100.0 |
| Synthesis example 4 | 29.8 | | | | 17.5 | 19.0 | | 15.3 | | 18.4 | 100.0 |
| Synthesis example 5 | 29.8 | | | | | 36.5 | | 15.3 | | 18.4 | 100.0 |
| Synthesis example 6 | 29.8 | 20.0 | | | | 16.5 | | 15.3 | | 18.4 | 100.0 |
| Synthesis example 7 | 29.8 | 17.5 | | | | 19.0 | 14.5 | | 19.2 | | 100.0 |
| Synthesis example 8 | 29.8 | 20.0 | | | | 16.5 | 14.5 | | 19.2 | | 100.0 |
| Synthesis example 9 | 37.0 | 44.0 | | | | 19.0 | | | | | 100.0 |
| Synthesis example 10 | 37.0 | | | | | 63.0 | | | | | 100.0 |

Synthesis of 2-hydroxyethyl Methacrylate Copolymer 300 g of dioxane was heated to 100° C. under a stream of nitrogen, and a mixed solution of 150 g of 2-hydroxyethyl methacrylate, 60 g of acrilonitrile, 79.5 g of methyl methacrylate, 10.5 g of methacrylic acid, and 1.2 g of benzoyl peroxide was then dripped in over a period of 2 hours. Fifteen minutes after completion of this addition, a further 300 g of dioxane and 0.3 g of benzoyl peroxide was added, and the mixture then allowed to react for 4 hours. Following completion of the reaction, the product mixture was diluted with methanol and poured into water to precipitate out the copolymer. The precipitate was vacuum dried at 70° C. to yield the 2-hydroxyethyl methacrylate copolymer disclosed in Japanese Unexamined Patent Application, First Publication No. Sho-50-118802. The acid value was 20.

Preparation of Photosensitive Composition Coating Liquids

Using each of the fluorine based surfactants of the synthesis examples 1 to 10, and the 2-hydroxyethyl methacrylate copolymer, a series of photosensitive composition coating liquids were prepared with the compositions shown in Table 4.

TABLE 4

| Photosensitive composition coating liquid | Units: g |
|---|---|
| 2-hydroxyethyl methacrylate copolymer (as disclosed in example 1 of Japanese Unexamined Patent Application, First Publication No. Sho-50-118802) | 1.75 |
| 2-methoxy-4-hydroxy-5-benzoylbenzenesulfonate salt of the condensation product of p-diazodiphenylamine and formaldehyde | 0.20 |
| Oil Blue #603 (manufactured by Orient Chemical Industries Ltd.) | 0.05 |
| Fluorine based surfactant of synthesis example 1 to 10 (solid) | 0.015 |
| Methyl glycol | 28.0 |
| Methylcellosolve acetate | 20.0 |

Examples 1 to 8 and Comparative Examples 1 and 2

In the examples 1 to 8, photosensitive compositions comprising the fluorine based surfactants of each of the synthesis examples 1 to 8 respectively were used, whereas in the comparative examples 1 and 2, photosensitive compositions comprising the fluorine based surfactants of the synthesis examples 9 and 10 respectively were used.

An aluminum sheet of thickness 0.30 mm was degreased by washing with an aqueous solution of sodium hydroxide, and then subjected to electrolytic polishing treatment in 2% aqueous hydrochloric acid to yield a grained sheet with an average center-line roughness (Ra) of 0.6 μm. The grained sheet was subsequently anodized in 20% aqueous sulfuric acid at a current density of 2 A/dm$^2$ to form an oxide film of 2.7 g/m$^2$. This anodized sheet was then immersed in a 2.5% aqueous solution of sodium silicate at 70° C. for 30 seconds, and then washed with water and dried to yield an aluminum support.

Each of the photosensitive composition coating liquids described above was then applied to an aluminum support using a roll coater at low speed, and subsequently dried at 100° C. for 3 minutes, to yield a photosensitive lithographic printing plate. The dried weight of the coating was 2.0 g/m$^2$.

A negative image film of solid printing and halftone dots, and a step wedge with a step difference of 0.15 were affixed to each of the thus obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the fourth step. Subsequently, an automatic developing apparatus PD-912 manufactured by Dainippon Screen Manufacturing Co. Ltd., and a negative plate developing solution ND-1 (dilution ratio 1:3) manufactured by Kodak Polychrome Graphics Japan Ltd. were used to carry out development of the exposed photosensitive lithographic printing plate for 20 seconds at 30° C., and a gum NF-2 manufactured by Kodak Polychrome Graphics Japan Ltd. was then applied. The thus formed lithographic printing plate was then used for printing. The results are shown in Table 5.

TABLE 5

| | Fluorine based surfactant | Uniformity of coating | Ink receptivity |
|---|---|---|---|
| Example 1 | Synthesis example 1 | A | 10 sheets |
| Example 2 | Synthesis example 2 | A | 14 sheets |
| Example 3 | Synthesis example 3 | A | 10 sheets |
| Example 4 | Synthesis example 4 | A | 15 sheets |
| Example 5 | Synthesis example 5 | A | 18 sheets |
| Example 6 | Synthesis example 6 | A | 10 sheets |
| Example 7 | Synthesis example 7 | A | 11 sheets |
| Example 8 | Synthesis example 8 | A | 11 sheets |
| Comparative Example 1 | Synthesis example 9 | A | 34 sheets |
| Comparative Example 2 | Synthesis example 10 | A | 39 sheets |

In the table, ink receptivity was evaluated by leaving the lithographic printing plate sitting for one week following application of the gum and then carrying out actual printing. The number of sheets printed before the ink began to transfer completely to the printing paper was recorded as indicative of the ink receptivity. Furthermore, the uniformity of the coating was judged visually based on factors such as irregularities in the gradation resulting from the drying process or the like, and streaking irregularities formed during the application or drying processes, and was awarded one of five grades from A to E. A represents an excellent result, and E represents a poor result.

As is evident from these examples, the uniformity of the coating in photosensitive lithographic printing plates comprising photosensitive compositions of the present invention matched the levels of conventional photosensitive lithographic printing plates (the comparative examples 1 and 2). Furthermore, in comparison with conventional plates, the lithographic printing plates comprising the photosensitive compositions of the present invention showed a considerable improvement in ink receptivity. Furthermore, the lithographic printing plates of examples 1, 3, and 6 to 8, which used an N-cyclic hydrocarbon substituted maleimide were also able to achieve a good quality printed product after fewer sheets than the lithographic printing plate of example 2 which used an N-acyclic hydrocarbon substituted maleimide, namely N-laurylmaleimide. In this manner, the use of an N-cyclic hydrocarbon substituted maleimide produces even better ink receptivity.

Synthesis of a Copolymer with a Side Chain Unsaturated Group 18.75 g of N,N-dimethylacetamide was placed in a 200 ml four necked flask equipped with a nitrogen inlet tube, a thermometer, and a stirrer, and heated to 80° C. While blowing nitrogen gas into the flask, a monomer solution comprising 9.0 g of 2-hydroxyethylmethacrylate, 7.0 g of methylmethacrylate, 4.0 g of methacrylic acid, and 0.5 g of 2,2'-azobis(2,4-dimethylvaleronitrile) dissolved in 18.75 g of N,N-dimethylacetamide was dripped into the flask over a period of one hour. The temperature of the reaction solution was maintained at 80° C., and one hour after completion of the addition of the monomer solution, a further 0.25 g of 2,2'-azobis(2,4-dimethylvaleronitrile) was added and the mixture stirred for a further one hour. Following completion of the polymerization reaction, the nitrogen gas being blown into the flask was replaced with air, 0.2 g of hydroquinone monomethyl ether was added, and the temperature was cooled to 50° C. At 50° C., 10.7 g of methacryloyloxyethylisocyanate and 0.1 g of a reaction catalyst dibutyl tin dilaurate were added, and the reaction then allowed to proceed for 3 hours. Following completion of the reaction, the temperature was cooled to room temperature and the reaction solution dripped into 2 liters of water to precipitate out the polymer. The polymer was filtered, washed and dried, and yielded 2.17 g of a copolymer with a side chain unsaturated group with a polystyrene conversion weight average molecular weight of 32,000.

Preparation of Photosensitive Composition Coating Liquids 2

Using each of the fluorine based surfactants of the synthesis examples 1 to 10 and the copolymer with a side chain unsaturated group described above, a series of photosensitive composition coating liquids were prepared with the compositions shown in Table 6.

TABLE 6

| Photosensitive composition coating liquid | Units: g |
|---|---|
| Copolymer with a side chain unsaturated group (as disclosed in example 1 of Japanese Unexamined Patent Application, First Publication No. Hei-10-282658) | 9.0 |

TABLE 6-continued

| Photosensitive composition coating liquid | Units: g |
|---|---|
| 4-dodecylbenzenesulfonate salt of the condensation product of p-diazodiphenylamine and formaldehyde | 1.0 |
| Dipentaerythritol hexaacrylate | 1.5 |
| Fluorine based surfactant of synthesis example 1 to 10 (solid) | 0.015 |
| 2-(4-methoxynaphthyl)-4,6-bis(trichloromethyl)-s-triazine | 0.20 |
| Malic acid | 0.10 |
| "Victoria Pure Blue" BOH (manufactured by Hodogaya Chemical Ind. Ltd.) | 0.20 |
| Methylglycol | 200.0 |

Examples 9 to 16, and Comparative Examples 3 and 4

In the examples 9 to 16, photosensitive compositions comprising the fluorine based surfactants of the synthesis examples 1 to 8 respectively were used, whereas in the comparative examples 3 and 4, photosensitive compositions comprising the fluorine based surfactants of the synthesis examples 9 and 10 respectively were used.

Each of the above photosensitive composition coating liquids was applied to an aluminum support using a roll coater at low speed, and subsequently dried at 100° C. for 3 minutes, to yield a photosensitive lithographic printing plate. The dried weight of the coating was 2.0 g/m².

A negative image film of solid printing and halftone dots, and a step wedge with a step difference of 0.15 were affixed to each of the thus obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the fourth step. Subsequently, an automatic developing apparatus PD-912 manufactured by Dainippon Screen Manufacturing Co. Ltd., and a negative plate developing solution ND-1 (dilution ratio 1:3) manufactured by Kodak Polychrome Graphics Japan Ltd. were used to carry out development of the exposed photosensitive lithographic printing plate for 20 seconds at 30° C., and a gum NF-2 manufactured by Kodak Polychrome Graphics Japan Ltd. was then applied. The thus formed lithographic printing plate was then used for printing. The results are shown in Table 7.

TABLE 7

| | Fluorine based surfactant | Uniformity of coating | Ink receptivity |
|---|---|---|---|
| Example 9 | Synthesis example 1 | A | 8 sheets |
| Example 10 | Synthesis example 2 | A | 12 sheets |
| Example 11 | Synthesis example 3 | A | 7 sheets |
| Example 12 | Synthesis example 4 | A | 12 sheets |
| Example 13 | Synthesis example 5 | A | 15 sheets |
| Example 14 | Synthesis example 6 | A | 8 sheets |
| Example 15 | Synthesis example 7 | A | 9 sheets |
| Example 16 | Synthesis example 8 | A | 9 sheets |
| Comparative Example 3 | Synthesis example 9 | A | 29 sheets |
| Comparative Example 4 | Synthesis example 10 | A | 31 sheets |

As is evident from these examples, the uniformity of the coating in photosensitive lithographic printing plates comprising photosensitive compositions of the present invention matched the levels of the conventional photosensitive lithographic printing plates (the comparative examples 3 and 4).

Furthermore, in comparison with conventional plates, the lithographic printing plates comprising the photosensitive compositions of the present invention showed a considerable improvement in ink receptivity. Furthermore, the lithographic printing plates of examples 11, 13, and 16 to 18, which used an N-cyclic hydrocarbon substituted maleimide were also able to achieve a good quality printed product after fewer sheets than the lithographic printing plate of example 12 which used an N-acyclic hydrocarbon substituted maleimide, namely N-laurylmaleimide. In this manner, the use of an N-cyclic hydrocarbon substituted maleimide produces even better ink receptivity.

Synthesis of a Fluorine based Oil Sensitizer

The monomers shown in Table 1 and Table 2 were combined in the proportions shown in Table 8, and fluorine based oil sensitizers were synthesized in the same manner as the synthesis examples 1 to 8.

coater at low speed, and subsequently dried at 100° C. for 3 minutes, to yield a photosensitive lithographic printing plate. The dried weight of the coating was 2.0 g/m².

A negative image film of solid printing and halftone dots, and a step wedge with a step difference of 0.15 were affixed to each of the thus obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the fourth step. Subsequently, an automatic developing apparatus PD-912 manufactured by Dainippon Screen Manufacturing Co. Ltd., and a negative plate developing solution ND-1 (dilution ratio 1:3) manufactured by Kodak Polychrome Graphics Japan Ltd. were used to carry out development of the exposed photosensitive lithographic printing plate for 20 seconds at 30° C., and a gum

TABLE 8

| | Monomer composition ratio of fluorine based oil sensitizer (wt %) | | | | | | Modifier | | |
|---|---|---|---|---|---|---|---|---|---|
| | A | B | D | E | G | H | I | J | Total |
| Synthesis example 11 | 29.8 | 36.5 | | | | 15.3 | | 18.4 | 100.0 |
| Synthesis example 12 | 29.8 | | 36.5 | | | 15.3 | | 18.4 | 100.0 |
| Synthesis example 13 | 29.8 | | | 36.5 | | 15.3 | | 18.4 | 100.0 |
| Synthesis example 14 | 29.8 | 36.5 | | | 14.5 | | 19.2 | | 100.0 |
| Synthesis example 15 | 29.8 | | 36.5 | | 14.5 | | 19.2 | | 100.0 |

Preparation of Photosensitive Composition Coating Liquids 3

Using each of the oil sensitizers of the synthesis examples 11 to 15, as well as the copolymer having a side chain unsaturated group described above and the fluorine based surfactant of the synthesis example 10, a series of photosensitive composition coating liquids were prepared with the compositions shown in Table 9.

TABLE 9

| Photosensitive composition coating liquid | Units: g |
|---|---|
| Copolymer with a side chain unsaturated group (as disclosed in example 1 of Japanese Unexamined Patent Application, First Publication No. Hei-10-282658) | 9.0 |
| 4-dodecylbenzenesulfonate salt of the condensation product of p-diazodiphenylamine and formaldehyde | 1.0 |
| Dipentaerythritol hexaacrylate | 1.5 |
| Oil sensitizer of synthesis example 11 to 15 (solid), or fluorine based surfactant of synthesis example 9 or 10 (solid) | 0.010 |
| Fluorine based surfactant of synthesis example 10 (solid) | 0.005 |
| 2-(4-methoxynaphthyl)-4,6-bis(trichloromethyl)-s-triazine | 0.20 |
| Malic acid | 0.10 |
| "Victoria Pure Blue" BOH (manufactured by Hodogaya Chemical Ind. Ltd.) | 0.20 |
| Methylglycol | 200.0 |

Examples 17 to 21, and Comparative Examples 5 and 6

In the examples 17 to 21, photosensitive compositions comprising the oil sensitizers of the synthesis examples 11 to 15 respectively were used, whereas in the comparative examples 9 and 10, photosensitive compositions comprising the fluorine based surfactants of the synthesis examples 9 and 10 respectively were used.

Each of the above photosensitive composition coating liquids was applied to an aluminum support using a roll NF-2 manufactured by Kodak Polychrome Graphics Japan Ltd. was then applied. The thus formed lithographic printing plate was then used for printing. The results are shown in Table 10.

TABLE 10

| | Fluororesin | Uniformity of coating | Ink receptivity |
|---|---|---|---|
| Example 17 | Synthesis example 11 | A | 6 sheets |
| Example 18 | Synthesis example 12 | A | 6 sheets |
| Example 19 | Synthesis example 13 | A | 10 sheets |
| Example 20 | Synthesis example 14 | A | 7 sheets |
| Example 21 | Synthesis example 15 | A | 8 sheets |
| Comparative Example 5 | Synthesis example 9 | A | 30 sheets |
| Comparative Example 6 | Synthesis example 10 | A | 33 sheets |

As is evident from these examples, the uniformity of the coating in photosensitive lithographic printing plates comprising photosensitive compositions of the present invention matched the levels of the conventional photosensitive lithographic printing plates (the comparative examples 5 and 6). Furthermore, in comparison with conventional plates, the lithographic printing plates comprising the photosensitive compositions of the present invention showed a considerable improvement in ink receptivity. Furthermore, in the examples 17 to 21, at least 100,000 sheets of clear prints were obtained, whereas in the comparative examples 5 and 6, scratches had appeared in the image area after 70,000 sheets.

Synthesis of a Fluorine based Alkali Soluble Resin

The monomers shown in Table 1, Table 2 and Table 11 were combined in the proportions shown in Table 12, and fluorine based alkali soluble resins were synthesized in the same manner as the synthesis examples 1 to 8.

TABLE 11

| Chemical formula | Abbreviation |
| --- | --- |
| $CH_2\!=\!C(CH_3)\!-\!CO\!-\!O\!-\!(CH_2)_2\!-\!NH\!-\!CO\!-\!NH\!-\!C_6H_4\!-\!OH$ | K |

TABLE 12

| | Monomer composition ratio of alkali soluble resin (wt %) | | | | | | | Modifier | Total |
| --- | --- | --- | --- | --- | --- | --- | --- | --- | --- |
| | A | D | K | G | H | I | J | | |
| Synthesis example 16 | 29.8 | | 40.7 | 13.4 | | | 16.1 | | 100.0 |
| Synthesis example 17 | 29.8 | 23.2 | | 27.8 | | | | 19.2 | 100.0 |
| Synthesis example 18 | 29.8 | | 36.5 | 14.5 | | | | 19.2 | 100.0 |

Preparation of Photosensitive Composition Coating Liquids 4

Using each of the alkali soluble resins of the synthesis examples 16 to 18, as well as the copolymer with a side chain unsaturated group described above and the fluorine based surfactant of the synthesis example 10, a series of photosensitive composition coating liquids were prepared with the compositions shown in Table 13.

TABLE 13

| Photosensitive composition coating liquid | Units: g |
| --- | --- |
| Copolymer with a side chain unsaturated group (as disclosed in example 1 of Japanese Unexamined Patent Application, First Publication No. Hei-10-282658) | 8.0 |
| 4-dodecylbenzenesulfonate salt of the condensation product of p-diazodiphenylamine and formaldehyde | 1.0 |
| Dipentaerythritol hexaacrylate | 1.5 |
| Alkali soluble resin of synthesis example 16 to 18 (solid) | 1.10 |
| Fluorine based surfactant of synthesis example 10 (solid) | 0.015 |
| 2-(4-methoxynaphthyl)-4,6-bis(trichloromethyl)-s-triazine | 0.20 |
| Malic acid | 0.10 |
| "Victoria Pure Blue" BOH (manufactured by Hodogaya Chemical Ind. Ltd.) | 0.20 |
| Methylglycol | 200.0 |

Examples 22 to 24, and Comparative Example 7

In the examples 22 to 24, photosensitive compositions comprising the alkali soluble resins of the synthesis examples 16 to 18 respectively were used, whereas in the comparative example 7, a photosensitive composition identical with the comparative example 6 was used.

Each of the above photosensitive composition coating liquids was applied to an aluminum support using a roll coater at low speed, and subsequently dried at 100° C. for 3 minutes, to yield a photosensitive lithographic printing plate. The dried weight of the coating was 2.0 g/m².

A negative image film of solid printing and halftone dots, and a step wedge with a step difference of 0.15 were affixed to each of the thus obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the fourth step. Subsequently, an automatic developing apparatus PD-912 manufactured by Dainippon Screen Manufacturing Co. Ltd., and a negative plate developing solution ND-1 (dilution ratio 1:3) manufactured by Kodak Polychrome Graphics Japan Ltd. were used to carry out development of the exposed photosensitive lithographic printing plate for 20 seconds at 30° C., and a gum NF-2 manufactured by Kodak Polychrome Graphics Japan Ltd. was then applied. The thus formed lithographic printing plate was then used for printing. The results are shown in Table 14.

TABLE 14

| | Alkali soluble resin | Uniformity of coating | Ink receptivity |
| --- | --- | --- | --- |
| Example 22 | Synthesis example 16 | A | 9 sheets |
| Example 23 | Synthesis example 17 | A | 11 sheets |
| Example 24 | Synthesis example 18 | A | 9 sheets |
| Comparative Example 7 | | A | 32 sheets |

As is evident from these examples, the uniformity of the coating in photosensitive lithographic printing plates comprising photosensitive compositions of the present invention matched the level of the conventional photosensitive lithographic printing plate (the comparative example 7). Furthermore, in comparison with the conventional plate, the lithographic printing plates comprising the photosensitive compositions of the present invention showed a considerable improvement in ink receptivity. Furthermore, in the examples 22 to 24, at least 100,000 sheets of clear prints were obtained, whereas in the comparative example 7, scratches had appeared in the image area after 70,000 sheets.

Preparation of Photosensitive Composition Coating Liquids 5

Using the alkali soluble resin of the synthesis example 16, and the copolymer with a side chain unsaturated group and a —CONHCOO— group as disclosed in example 5 of Japanese Unexamined Patent Application, First Publication No. Hei-10-069080, photosensitive composition coating liquids were prepared with the compositions shown in Table 15.

TABLE 15

| Photosensitive composition coating liquid (units: g) | Example 25 | Comparative example 8 |
| --- | --- | --- |
| Copolymer with a side chain unsaturated group (as disclosed in example 5 of Japanese Unexamined Patent Application, First Publication No. Hei-10-069080) | 8.0 | 9.1 |

TABLE 15-continued

| Photosensitive composition coating liquid (units: g) | Example 25 | Comparative example 8 |
|---|---|---|
| Butylnaphthalenesulfonate salt of the condensation product of p-diazodiphenylamine/p-methoxybenzoic acid (1:1 mol ratio) and formaldehyde | 1.0 | 1.0 |
| Dipentaerythritol hexaacrylate | 1.5 | 1.5 |
| Alkali soluble resin of synthesis example 16 (solid) | 1.10 | — |
| Fluorine based surfactant of synthesis example 10 (solid) | 0.015 | 0.015 |
| 2-(4-methoxynaphthyl)-4,6-bis(trichloromethyl)-s-triazine | 0.20 | 0.20 |
| Malic acid | 0.10 | 0.10 |
| "Victoria Pure Blue" BOH (manufactured by Hodogaya Chemical Industries Ltd.) | 0.20 | 0.20 |
| Methylglycol | 200.0 | 200.0 |

Example 25 and Comparative Example 8

Each of the above photosensitive composition coating liquids was applied to an aluminum support using a roll coater at low speed, and subsequently dried at 100° C. for 3 minutes, to yield a photosensitive lithographic printing plate. The dried weight of the coating was 2.0 g/m².

A negative image film of solid printing and halftone dots, and a step wedge with a step difference of 0.15 were affixed to each of the thus obtained photosensitive lithographic printing plates. Using a metal halide lamp with an output of 2 kW positioned 1 m from the photosensitive lithographic printing plate, the photosensitive lithographic printing plate was then exposed for an exposure period which produced an optical sensitivity at the fourth step. Subsequently, an automatic developing apparatus PD-912 manufactured by Dainippon Screen Manufacturing Co. Ltd., and a positive plate developing solution PD-1 (dilution ratio 1:8) manufactured by Kodak Polychrome Graphics Japan Ltd. were used to carry out development of the exposed photosensitive lithographic printing plate for 12 seconds at 30° C., and a gum NF-2 manufactured by Kodak Polychrome Graphics Japan Ltd. was then applied. The thus formed lithographic printing plate was then used for printing. The results are shown in Table 16.

TABLE 16

| | Alkali soluble resin | Uniformity of coating | Ink receptivity | Printing Test |
|---|---|---|---|---|
| Example 25 | Synthesis example 16 | A | 15 sheets | More than 80,000 sheets |
| Comparative Example 7 | None | A | 35 sheets | Scratches appeared in image area after 40,000 sheets |

As is evident from the example 25, the uniformity of the coating in the photosensitive lithographic printing plate comprising a photosensitive composition of the present invention matched the level of the conventional photosensitive lithographic printing plate (comparative example 8). Furthermore, in comparison with the conventional plate, the lithographic printing plate comprising the photosensitive composition of the present invention showed a considerable improvement in ink receptivity. Furthermore, in the example 25, at least 80,000 sheets of clear prints were obtained, whereas in the comparative example 8, scratches had appeared in the image area after 40,000 sheets.

As described above, a photosensitive composition of the present invention includes a fluororesin having a fluoro aliphatic group of 3 to 20 carbon atoms in which at least two of three terminal hydrogen atoms are substituted with fluorine atoms and an ethylene based unsaturated group, as well as a negative photosensitive compound, and enables the production of a photosensitive lithographic printing plate which displays superior ink receptivity and superior film strength of the photosensitive layer (image area).

Furthermore, if the fluororesin also includes a poly (oxyalkylene) group, then a photosensitive lithographic printing plate can be produced which not only displays superior ink receptivity, but also provides a uniform photosensitive layer coating.

Furthermore, if the fluororesin also includes a functional group having an acidic hydrogen atom, then a photosensitive lithographic printing plate can be produced which displays superior ink receptivity and superior film strength of the photosensitive layer (image area), and moreover can be developed in an alkali developing solution incorporating no organic solvents.

Furthermore, if the fluororesin also has a maleimide structure, then a photosensitive lithographic printing plate can be produced which displays even more superior ink receptivity.

Furthermore, if the fluororesin is an acrylic resin, then the quantities of the Rf group, the ethylene based unsaturated group, the functional group having an acidic hydrogen atom, and the poly (oxyalkylene) group can be controlled easily.

Furthermore, if the photosensitive composition of the present invention also includes a binder resin, then properties such as the developability, the press life, the solvent resistance and the chemical resistance of the photosensitive lithographic printing plate can be improved.

Furthermore, a photosensitive lithographic printing plate of the present invention is produced by providing a photosensitive composition of the present invention on a support, and so the photosensitive lithographic printing plate either displays superior ink receptivity and superior film strength of the photosensitive layer (image area), or displays superior ink receptivity and comprises a uniform photosensitive layer, or displays superior ink receptivity and superior film strength of the photosensitive layer (image area) and moreover can be developed in an alkali developing solution incorporating no organic solvents.

What is claimed is:

1. A photosensitive composition comprising:
   a fluororesin having a fluoro aliphatic group of 3 to 20 carbon atoms in which at least two of three terminal hydrogen atoms are substituted for fluorine atoms, an ethylene based unsaturated group, and a poly (oxyalkylene) group; and a negative photosensitive compound.

2. A photosensitive composition according to claim 1, wherein said fluororesin further comprises a functional group having an acidic hydrogen atom.

3. A photosensitive composition according to claim 1, wherein said fluororesin further comprises a maleimide structure.

4. A photosensitive composition according to claim 1, wherein said fluororesin is an acrylic resin.

5. A photosensitive composition according to claim 1, further comprising a binder resin.

6. A photosensitive lithographic printing plate comprising a photosensitive composition of claim 1 provided on a support.

7. A photosensitive composition comprising:
- an oil sensitizer including a fluororesin having a fluoro aliphatic group of 3 to 20 carbon atoms in which at least two of three terminal hydrogen atoms are substituted for fluorine atoms, and an ethylene based unsaturated group;
- a fluorine based surfactant including a fluororesin having a fluoro aliphatic group of 3 to 20 carbon atoms in which at least two of three terminal hydrogen atoms are substituted for fluorine atoms, an ethylene based unsaturated group, and a poly (oxyalkylene) group;
- an alkali soluble resin including a fluororesin having a fluoro aliphatic group of 3 to 20 carbon atoms in which at least two of three terminal hydrogen atoms are substituted for fluorine atoms, an ethylene based unsaturated group, and an acidic hydrogen atom; and
- a negative photosensitive compound.

8. A photosensitive composition according to claim 7, wherein the oil sensitizer is included in the range from 0.01 to 10% by weight, relative to the total weight of the photosensitive composition.

9. A photosensitive composition according to claim 7, wherein the fluorine based surfactant is included in the range from 0.01 to 5% by weight, relative to the total weight of the photosensitive composition.

10. A photosensitive composition according to claim 7, wherein the alkali soluble resin is included in the range from 0.01 to 30% by weight, relative to the total weight of the photosensitive composition.

11. A photosensitive composition according to claim 7, wherein said fluororesin further comprises a maleimide structure.

12. A photosensitive composition according to claim 7, wherein said fluororesin is an acrylic resin.

13. A photosensitive composition according to claim 7, further comprising a binder resin.

14. A photosensitive lithographic printing plate comprising a photosensitive composition of claim 7 provided on a support.

15. A photosensitive composition for lithographic printing comprising:
- an oleophilic photosensitive fluororesin having a fluoro aliphatic group of 3 to 20 carbon atoms in which at least two of three terminal hydrogen atoms are substituted for fluorine atoms, an ethylene based unsaturated group, a maleimide structure, and a binder resin; and
- a negative photosensitive compound.

16. A photosensitive composition according to claim 15, wherein said maleimide structure is a N-substituted maleimide structure.

17. A photosensitive composition according to claim 15, wherein said fluororesin further comprises a poly (oxyalkylene) group.

18. A photosensitive composition according to claim 15, wherein said fluororesin further comprises a functional group having an acidic hydrogen atom.

19. A photosensitive composition according to claim 15, wherein said fluororesin is an acrylic resin.

20. A photosensitive lithographic printing plate comprising a photosensitive composition of claim 15 provided on a support.

21. A photosensitive composition for lithographic printing comprising:
- a fluororesin having a fluoro aliphatic group of 3 to 20 carbon atoms in which at least two of three terminal hydrogen atoms are substituted for fluorine atoms, an ethylene based unsaturated group, where the fluororesin is an acrylic resin containing a maleimide structure; and
- a negative photosensitive compound.

22. A photosensitive composition according to claim 21, wherein said maleimide structure is a N-substituted maleimide stucture.

23. A photosensitive composition according to claim 21, wherein said fluororesin further comprises a poly (oxyalkylene) group.

24. A photosensitive composition according to claim 21, wherein said fluororesin further comprises a functional group having an acidic hydrogen atom.

25. A photosensitive lithographic printing plate comprising a photosensitive composition of claim 21 provided on a support.

* * * * *